(12) United States Patent
Byggmästar et al.

(10) Patent No.: US 12,031,872 B2
(45) Date of Patent: Jul. 9, 2024

(54) INDIVIDUAL CONTROL OF INNER AND OUTER PELTIER ELEMENTS

(71) Applicant: Beamex Oy Ab, Pietarsaari (FI)

(72) Inventors: Mats Byggmästar, Pietarsaari (FI);
Taija Maunumäki, Kokkola (FI);
Tuomo Heiskanen, Kokkola (FI);
Taavi Põldsam, Pietarsaari (FI)

(73) Assignee: Beamex Oy Ab, Pietarsaari (FI)

( * ) Notice: Subject to any disclaimer, the term of this patent is extended or adjusted under 35 U.S.C. 154(b) by 332 days.

(21) Appl. No.: 17/080,571

(22) Filed: Oct. 26, 2020

(65) Prior Publication Data

US 2021/0123823 A1    Apr. 29, 2021

(30) Foreign Application Priority Data

Oct. 28, 2019   (FI) ..................................... 20195924

(51) Int. Cl.
*G01K 15/00*    (2006.01)
*H10N 10/17*    (2023.01)

(52) U.S. Cl.
CPC ........... *G01K 15/005* (2013.01); *H10N 10/17* (2023.02)

(58) Field of Classification Search
CPC ........ G01K 15/005; G01K 7/00; G01K 15/00; H01L 35/32; F25B 2700/2107; F25B 49/00; F25B 2321/0212; F25B 21/04; F25B 21/02; G05D 23/22
See application file for complete search history.

(56) References Cited

U.S. PATENT DOCUMENTS

| | | | | |
|---|---|---|---|---|
| 5,450,727 A | * | 9/1995 | Ramirez | ................. F25B 21/02 |
| | | | | 165/259 |
| 5,515,683 A | | 5/1996 | Kessler | |
| 6,065,293 A | * | 5/2000 | Ghoshal | ................. H01L 23/38 |
| | | | | 62/3.2 |
| 7,607,309 B2 | * | 10/2009 | Liebmann | ............ G01K 15/005 |
| | | | | 62/3.3 |

(Continued)

FOREIGN PATENT DOCUMENTS

| | | | |
|---|---|---|---|
| CN | 103592056 A | * | 2/2014 |
| CN | 205449790 U | * | 8/2016 |

(Continued)

OTHER PUBLICATIONS

17080571_Oct. 12, 2023_JP_2008010295_A_H.pdf,Jan. 2008.*

(Continued)

*Primary Examiner* — Gail Kaplan Verbitsky
(74) *Attorney, Agent, or Firm* — Thomas | Horstemeyer, LLP

(57) ABSTRACT

The present invention introduces a temperature calibrator arrangement, which comprises inner and outer Peltier elements as heating and cooling elements for the calibrator block. The arrangement comprises a first and second variable current or voltage source, and, in an embodiment, a first and second mechanical relay for switching polarities of the Peltier elements. The present invention controls the first and second current sources independently of one another. Furthermore, some methods are presented for getting rid of mechanical relay switchings while using the temperature calibrator during normal use, resulting in less clicking sounds and less physical wear as well.

10 Claims, 3 Drawing Sheets

(56) References Cited

U.S. PATENT DOCUMENTS

| | | | |
|---|---|---|---|
| 7,861,538 B2* | 1/2011 | Welle | F25B 21/04 236/94 |
| 8,117,848 B2 | 2/2012 | Liebmann et al. | |
| 2007/0157628 A1* | 7/2007 | Onoue | H01L 23/38 62/3.2 |
| 2007/0289314 A1* | 12/2007 | Liebmann | F25B 21/04 374/1 |
| 2007/0291814 A1* | 12/2007 | Hirst | G01K 15/005 374/1 |
| 2007/0291815 A1 | 12/2007 | Walker et al. | |
| 2010/0103975 A1 | 4/2010 | Haslund et al. | |
| 2013/0276464 A1* | 10/2013 | Chien | H10N 10/13 62/3.3 |
| 2015/0121899 A1* | 5/2015 | Nakajima | F25B 21/04 62/3.3 |
| 2015/0338289 A1 | 11/2015 | Friedrichs | |

FOREIGN PATENT DOCUMENTS

| | | | | |
|---|---|---|---|---|
| DE | 4101644 A1 * | 1/1991 | | |
| DE | 20320911 U1 * | 6/2005 | | A61F 7/02 |
| DE | 202005006710 | 7/2005 | | |
| DE | 202005006710 U1 * | 8/2005 | | G01K 15/005 |
| DE | 102015116661 B3 * | 10/2016 | | G01K 15/002 |
| DE | 102015112255 A1 * | 2/2017 | | |
| EP | 2947439 A1 * | 11/2015 | | G01K 15/002 |
| JP | 09243552 A * | 9/1997 | | |
| JP | 2008010295 A * | 1/2008 | | |
| JP | 4250022 B2 * | 4/2009 | | |
| JP | 20170523373 | 10/2015 | | |
| KR | 101393053 B1 * | 5/2014 | | |
| KR | 20140113029 A * | 9/2014 | | |
| RU | 2561483 C1 * | 8/2015 | | |
| SU | 1084691 A * | 4/1984 | | |
| WO | WO-2019151650 A1 * | 8/2019 | | B67D 1/0801 |
| WO | WO-2019179229 A1 * | 9/2019 | | F27D 21/0014 |

OTHER PUBLICATIONS

17080571_Oct. 16, 2023_JP_09243552_A_H.pdf,Sep. 1997.*
2017-02-0217080571_Mar. 5, 2024_DE_102015112255,Feb. 2, 2017.*
European Search Report Application No. 20203758.6 mailed Mar. 26, 2021.
Search Report for Finnish Application No. 20195924 issued Jun. 17, 2020.

* cited by examiner

INDIVIDUAL CONTROL OF INNER AND OUTER PELTIER ELEMENTS

CROSS-REFERENCE TO RELATED APPLICATION

This application claims benefit of and priority to Finnish Application No. 20195924, filed, Oct. 28, 2019. The entire content of which is incorporated herein by reference.

TECHNICAL FIELD

The present invention relates to temperature calibrators, i.e. so-called dry blocks, which can be widely used in various industrial processes and plants, for instance. The present invention especially relates to obtaining a wide temperature range with using heating/cooling elements in the temperature calibrator.

BACKGROUND

Temperature calibrators are measurement units which are made for industrial field use, and they can be manufactured as relatively small units to be carriable around a plant. Temperature calibrators can also be called as dry blocks, dry block calibrators or calibrator blocks, meaning exactly the same. Temperature calibrators may be manufactured in different temperature range variations, e.g. by having a dry block which is suitable for calibrating temperatures of −30° C. . . . +150° C., and another dry block for calibrating temperatures of +50° C. . . . +660° C., to merely give some examples on different temperature range options.

When using a temperature calibrator applying e.g. the temperature range of −30° C. . . . +150° C. (also called as "a cold dry block"), there is a need to achieve hotter and colder temperatures in the temperature calibrator than which can be obtained with a single Peltier element; also called as a thermoelectric cooler (TEC). The use of a Peltier element, applying so-called Peltier effect, is known for general heating and cooling purposes, where the principle of the Peltier effect is to use an element with two different conducting materials, and pass an electric current through it. Heat is created at a first junction and absorbed at a second junction of the element. Thermoelectric heating and cooling is thus possible, and such Peltier elements in general are known to be used in heating and cooling of the temperature calibrators. However, the temperature difference over a single Peltier element (i.e. temperature difference required between the temperature calibrator itself and a heatsink which is close to ambient temperature) is not enough.

When a larger temperature difference is needed than what can be achieved with a single Peltier element, two or more Peltier elements can be stacked on top of each other, where each Peltier element layer in the stack will contribute to the finally obtained temperature difference. The use of a plurality of Peltier elements in this way is known in prior art as such.

FIG. 1 shows an example of a practical calibrator block 11 (i.e. a temperature calibrator) with two heatsinks 12, 13, one on each side of the calibrator block 11 for obtaining symmetry. There is an upper ("top") set of Peltier elements 14, 15 to control the temperature in the top end of the calibrator block 11, and a lower ("bottom") set of Peltier elements 16, 17 to control the temperature in the bottom end of the calibrator block 11. The arrangement is assembled in this way so that an axial (i.e. vertical) temperature gradient in the calibrator block 11 can be controlled and minimized. A temperature calibrator 11 tries to achieve a homogenous temperature field in the temperature calibrator 11 without any temperature gradients in any directions.

FIG. 1 also shows two layers of Peltier elements, "inner" 14, 16 and "outer" 15, 17 on both sides of the calibrator block 11. Later in this disclosure, only one end of the calibrator block 11 is described, but the same principle also applies to the other end of the calibrator block 11.

In other words, "top inner" Peltier elements 14 are connected to the calibrator block 11, while "top outer" Peltier elements 15 are connected between the elements 14 and the heatsink 12, 13, respectively. A similar kind of connection is made in the bottom side, with "bottom inner" Peltier elements 16 connected to the calibrator block 11, and "bottom outer" Peltier elements 17 being connected between the elements 16 and the heatsink 12, 13, respectively.

Due to electrical and physical properties of Peltier elements, which are low efficiency and internal resistance that results in self-heating, each Peltier element i.e. layer needs a suitable current to achieve a maximum total temperature difference and heat flow.

When cooling the temperature calibrator 11, i.e. when transporting heat away from the calibrator block 11 into the heatsink 12, 13, the outer elements 15, 17 (closest to the heatsink 12, 13) need about twice as much current compared to the inner elements 14, 16 (closest to the calibrator block 11). This is because the outer elements 15, 17 must transport the same heat as the inner elements 14, 16, plus the heat produced inside the inner elements 14, 16 due to self-heating.

The situation will be opposite, when heating the calibrator block 11. When the heating takes place, the inner elements 14, 16 need about twice the current compared to the outer elements 15, 17. Furthermore, the polarity of the current must be opposite compared to the cooling situation.

These two scenarios can be achieved with the following electrical configurations of the inner and outer elements (i.e. a combined series and parallel connection of the Peltier elements), illustrated in FIG. 2.

FIG. 2a thus illustrates a Peltier element arrangement for a cooling configuration of the temperature calibrator used in prior art. FIG. 2b correspondingly illustrates a Peltier element arrangement for a heating configuration of the temperature calibrator used in prior art.

In FIG. 2a, two top inner Peltier elements 23a-b are connected in parallel, whereafter two top outer Peltier elements 24a-b are connected in series. The current is directed to the two top inner Peltier elements 23a-b first. The result of this connection is that the current flowing through the top inner Peltier elements is only half of the current flowing through the top outer Peltier elements. The current ratio could be described as being 1:2. This arrangement is suitable for a cooling action.

Respectively in FIG. 2b, two top outer Peltier elements 26a-b are connected in parallel, whereafter two top inner Peltier elements 25a-b are connected in series. The current is directed to the two top outer Peltier elements 26a-b first. The result of this connection is that the current flowing through the top outer Peltier elements is only half of the current flowing through the top inner Peltier elements. The current ratio could be described as being 2:1. This arrangement is suitable for a heating action.

Such Peltier element arrangements applied in temperature calibration devices have been noted in prior art, e.g. in mutually related U.S. Pat. No. 7,607,309 (Liebmann 1) and U.S. Pat. No. 8,117,848 (Liebmann 2), where they reconfigure the wirings to the Peltier elements; see FIG. 5 in both Liebmann 1 & 2, where there is a switching arrangement in the bottom part of the circuitry. There is a separate cooling configuration (see FIG. 6) and a heating configuration (see FIG. 7) as well. The purpose is to provide a wide temperature range for the temperature calibration device.

The problem in prior art is that the inner and outer Peltier elements have been driven with a single current or voltage for both heating and cooling, which means that the optimal current ratio between the inner and outer elements (discussed above) is not reached in all use situations of the temperature calibrator.

Another problem using mechanical relays is the relay clicking, causing mechanical wear on the relay, together with an irritating sound to the users working in close vicinity of the temperature calibrator.

SUMMARY OF THE INVENTION

In a first aspect of the invention, it introduces a temperature calibrator arrangement, comprising a calibrator block (11), a processor, heating and cooling elements (14-17), and a heatsink (12, 13), wherein the arrangement comprises:
the heating and cooling elements (14-17) comprising inner Peltier elements (14, 16, 36) and outer Peltier elements (15, 17, 38) with regard to the calibrator block (11); and
a DC power supply (32).
The arrangement is characterized in that the arrangement further comprises:
a first variable current or voltage source (33) and a second variable current or voltage source (34), configured to feed the inner (14, 16, 36) and the outer (15, 17, 38) Peltier elements, respectively; wherein
the first variable current or voltage source (33) is configured to be controlled independently of the second variable current or voltage source (34) by the processor.

In a second aspect of the invention, it introduces a method for controlling of heating and cooling elements (14-17) of a temperature calibrator arrangement, the arrangement further comprising a calibrator block (11), a processor, a heatsink (12, 13) and a DC power supply (32), wherein the heating and cooling elements (14-17) comprise inner Peltier elements (14, 16, 36) and outer Peltier elements (15, 17, 38) with regard to the calibrator block (11). The method is characterized in that the method comprises the following steps of:
feeding a first variable current or voltage from a first variable current or voltage source (33) into the inner (14, 16, 36) Peltier elements;
feeding a second variable current or voltage from a second variable current or voltage source (34) into the outer (15, 17, 38) Peltier elements; wherein
controlling, by the processor, the first variable current or voltage source (33) independently of the second variable current or voltage source (34).

In a third aspect of the invention, it introduces a computer program for controlling of heating and cooling elements (14-17) of a temperature calibrator arrangement, the arrangement further comprising a calibrator block (11), a processor, a heatsink (12, 13) and a DC power supply (32), wherein the heating and cooling elements (14-17) comprise inner Peltier elements (14, 16, 36) and outer Peltier elements (15, 17, 38) with regard to the calibrator block (11), the computer program comprising program code executable in the processor. The computer program is characterized in that when executed, the computer program is configured to perform the steps of:
feeding a first variable current or voltage from a first variable current or voltage source (33) into the inner (14, 16, 36) Peltier elements;
feeding a second variable current or voltage from a second variable current or voltage source (34) into the outer (15, 17, 38) Peltier elements; wherein
controlling, by the processor, the first variable current or voltage source (33) independently of the second variable current or voltage source (34).

Various embodiments are disclosed in dependent arrangement claims, and these features can also be applied in a corresponding method and in a corresponding computer program.

DETAILED DESCRIPTION OF THE INVENTION

In the present invention, the purpose is to have separate and independently controllable driver channels for both inner and outer Peltier elements applied in a temperature calibrator.

Figure 3:
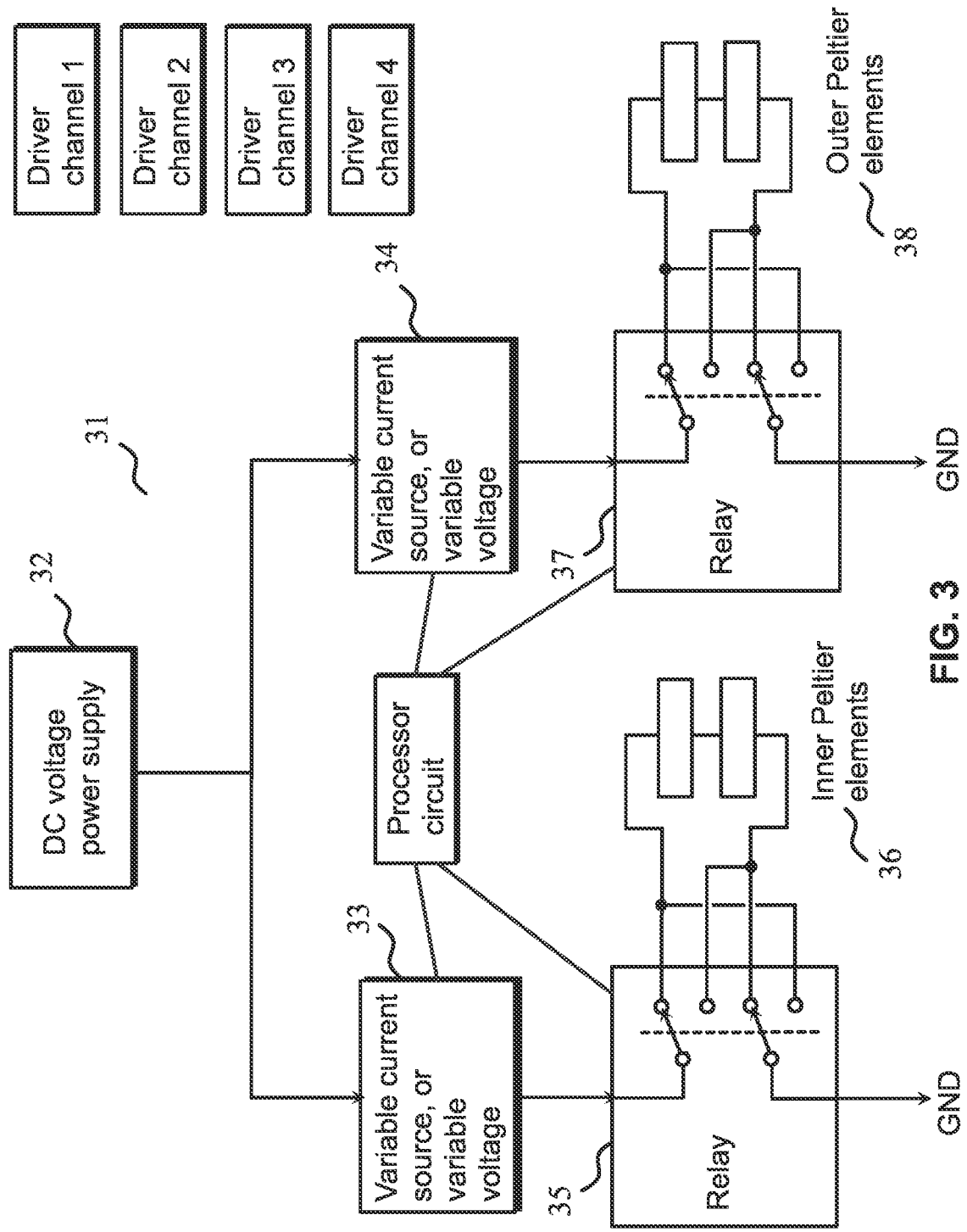
FIG. 3 illustrates a circuitry arrangement according to an embodiment of the present invention.

FIG. 3 illustrates an embodiment of the present invention in a form of a circuitry arrangement 31, achieving this goal. This illustration shows the circuitry for only one end of the calibrator block. This means that in order to control all the elements in the arrangement shown in FIG. 1, two circuits according to FIG. 3 are required, i.e. a total of four independent driver channels.

In FIG. 3, we have a first driver circuit for supplying the inner Peltier elements 36, and a second driver circuit for supplying the outer Peltier elements 38. A main power source is the DC voltage power supply 32. The first driver circuit comprises a first variable current or voltage source 33 and a first mechanical relay 35. The first mechanical relay 35 is connected to the inner Peltier elements 36. The second driver circuit comprises a second variable current or voltage source 34 and a second mechanical relay 37. The second mechanical relay 37 is connected to the outer Peltier elements 38. The other terminal of the first and second mechanical relays 35, 37 is connected to the ground.

This allows us to achieve the same effect as with the "reconfiguration" described in the background, but without actually reconfiguring in the same way as described there. The present invention is about supplying a wanted (i.e. desired or predetermined) current from a relevant driver channel to the inner and outer Peltier elements 36, 38. It is notable that the mechanical relays 35, 37 are only used for changing the polarity of the output current, i.e. changing between the heating and cooling procedures.

Thus, there are two optional setups; the first setup comprising mechanical relays and the second setup can be arranged without them. In other words, in an embodiment, the first variable current or voltage source 33 and the second variable current or voltage source 34 are both bipolar. In another embodiment, the first variable current or voltage source 33 and the second variable current or voltage source 34 are both unipolar, and that the arrangement further comprises a first mechanical relay 35 selecting the polarity of the first current through the inner Peltier elements 14, 16, 36, and a second mechanical relay 37 selecting the polarity of the second current through the outer Peltier elements 15, 17, 38, where both first and second mechanical relays 35, 37 are independently controllable by the processor.

Furthermore, the presented embodiment allows optimizing the current ratio between the inner and outer Peltier elements 35, 37, which typically is not exactly 2:1 or 1:2. The presented arrangement also allows the current ratio to be optimized with respect to temperature. The properties of Peltier elements are temperature-dependent. The procedure can be described as follows. With an optimal current ratio, the Peltier elements run cooler, i.e. produce less waste heat. This means that the heatsink and the cooling fan can be smaller and lighter. They also require less input power, thus requiring a smaller and possibly lighter power supply. Thus, many physical parts of the temperature calibrator can be built as a lighter element, resulting in significant advantages in a portable temperature calibrator concerning manufacturing and practical issues, and the ease of use/moving situations of the device.

In the present invention, for simplicity and robustness, the mechanical relay 35, 37 is used to change the polarity of the output current from sources 33, 34, in order to switch between heating and cooling. The same thing can also be achieved by having bipolar drivers, i.e. the GND in FIG. 3 would then be replaced with a negative supply (not shown), so that the driver output could swing between positive and negative output currents or voltages, without needing a polarity switching relay.

A drawback with the mechanical polarity switching relay 35, 37 is that when the temperature calibrator's temperature set-point is very close to the ambient temperature, the needed output current to the Peltier elements 36, 38 is close to zero. Due to measurement noise, and that the temperature regulator is trying to keep the setpoint temperature steady, the output current or voltage will change back and forth around zero, causing the polarity switching relay 35, 37 to frequently change polarity, i.e. to audibly "click". This causes mechanical wear on the relay 35, 37. Furthermore, it is annoying to listen to.

Thus, in an embodiment of the invention addressing the above-mentioned situation, the relay clicking is eliminated in the following alternative ways, which are possible because of the individual control of inner 36 and outer 38 Peltier elements:

A) The outer Peltier elements 38 can have a relatively small fixed positive current but significantly larger than the typical noise amplitude that would create a small fixed temperature offset in the Peltier element stack. The inner Peltier elements 36 would be used to regulate the temperature in the temperature calibrator, as it is normally done. The inner Peltier elements 36 would then naturally compensate for the temperature offset plus do the normal regulation needed for keeping the set-point steady. The inner Peltier elements 36 would end up having a negative current to compensate for the temperature offset. The current through both layers would then end up having an opposite sign and amplitude would not be close to zero. As a result, there would not be any relay clicking anymore. Thus, the mechanical wear is diminished and the annoying sound is not present anymore.

B) The outer Peltier elements 38 would only be allowed to have a positive current from 0 . . . +max, i.e. only perform heating, and the inner Peltier elements 36 would only be allowed to have a negative current 0 . . . −max, i.e. only perform cooling. The output current for each layer would not need to pass zero, i.e. the relays 35, 37 would not need to change polarity.

C) Both Peltier element layers could have a small fixed current offset (but significantly larger than the typical noise amplitude) but with an opposite sign, i.e. outer Peltier elements 38 a plus-signed offset and inner Peltier elements 36 a minus-signed offset. Both layers would be used to regulate the temperature in the temperature calibrator, as is normally done. Because both layers have current offsets of opposite signs, the temperature offsets are neutralized, but both of the currents would not be close to zero, and thus, there would not be any relay clicking anymore.

Above alternative methods will also work by reversing polarities and changing the heating and cooling Peltier element layers as vice versa.

The presented embodiments are considered to operate well because the needed temperature adjustment in the temperature calibrator close to ambient is very small. In other words, it is not a problem that the inner 36 and outer 38 Peltier element layers are fighting against each other. For instance, method C) from the above has been tested in practice with fixed current offsets of +100 mA and −100 mA, and this method worked exactly as predicted in the above.

Figure 1:
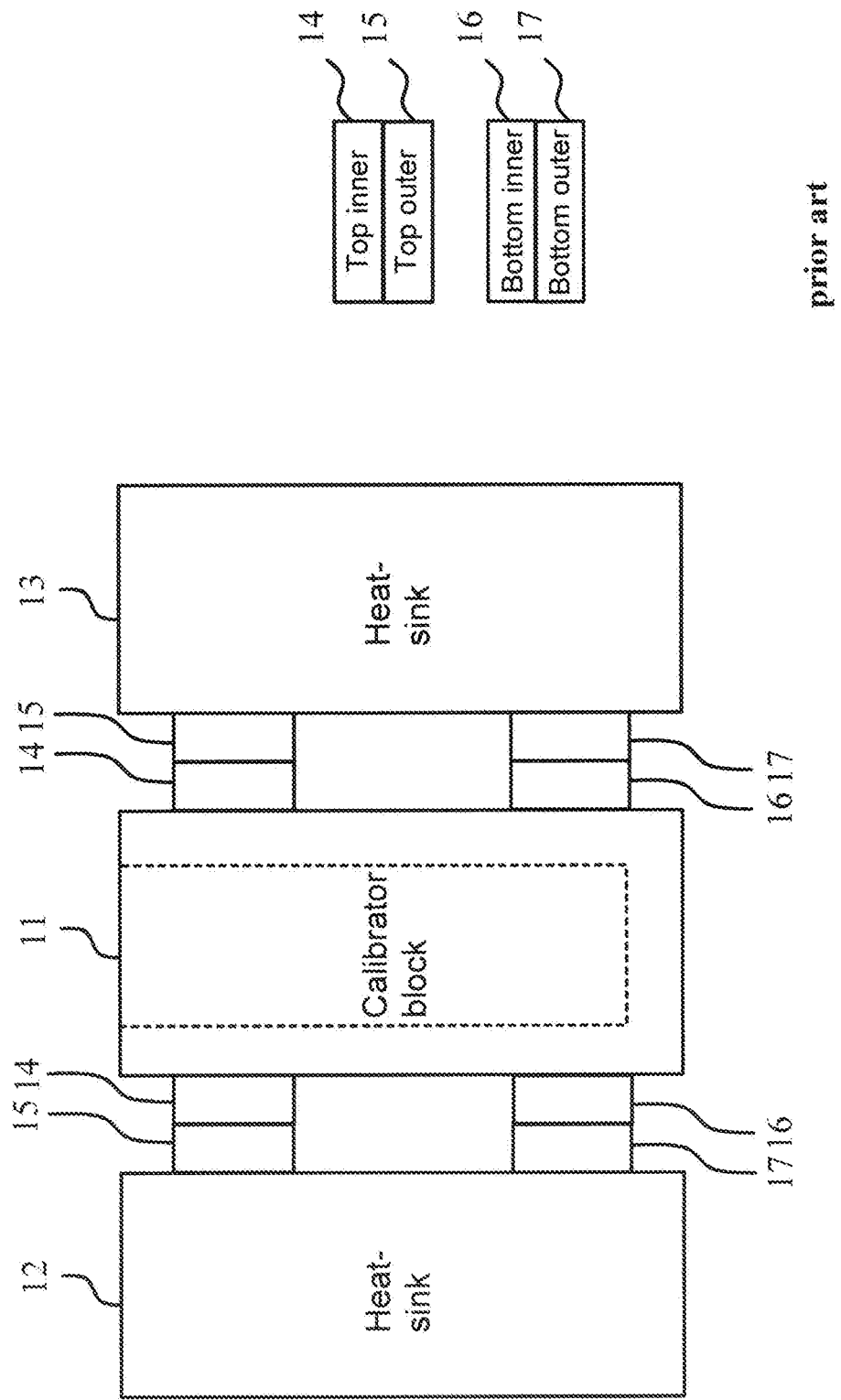
FIG. 1 illustrates an arrangement comprising a temperature calibrator with two heatsinks, with two layers of Peltier elements, according to prior art.
Figure 2:
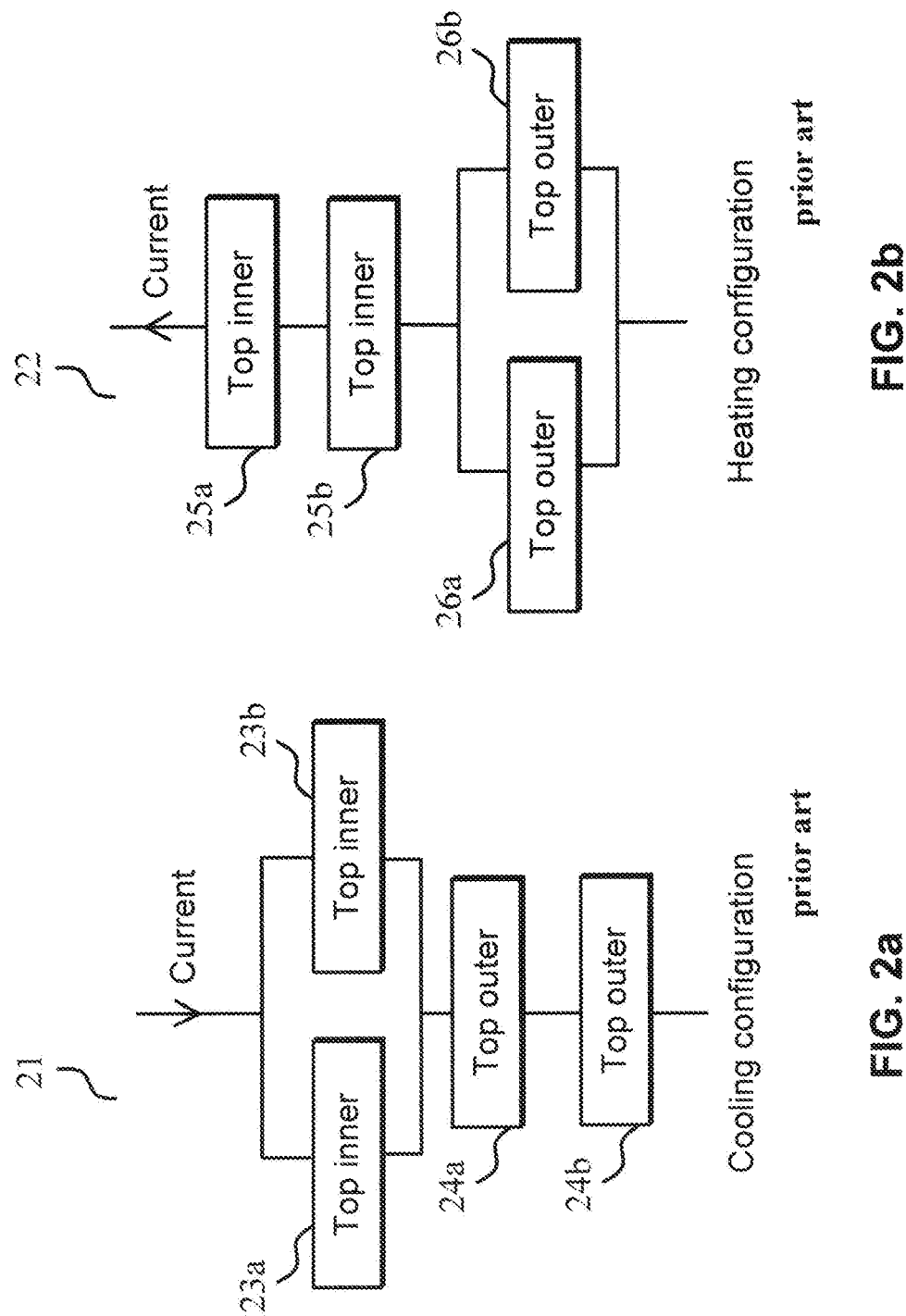
FIGS. 2a and 2b illustrate a Peltier element arrangement for a cooling and a heating configuration, respectively, according to prior art.

As a result from the inventive principle of FIG. 3 embodied in a setup shown in FIG. 1, there are four independently controllable driver channels for all the Peltier elements, comprising both top and bottom, and also both inner and outer elements. In other words, all four driver signals are independent from the other driver signals; meaning that each "unit" of Peltier elements (i.e. top inner 14, top outer 15, bottom inner 16, bottom outer 17) are also independently controllable. Because technically e.g. top inner 14 Peltier elements comprise two elements connected in series for temperature symmetry, it can be said that all four Peltier element pairs 14-17 are independently controllable by the four independent driver channels. This is the case for all "units" of Peltier elements, resulting in eight elements in total, controlled by the four independent driver channels.

As advantages of the above discussed relay clicking elimination principles (i.e. the second discussed aspect), these embodiments result in less clicking sounds and less physical wear of the mechanical relays. This leads to less irritating sounds for the calibrator users and other possible workers nearby, and to longer service lives of the mechanical relays.

As an advantage of the first discussed aspect of the independently controlled driver circuits, it allows the optimization of the current ratios so that the most efficient heating and cooling is possible with the Peltier elements if quick temperature changes are required within the temperature calibrator.

The present invention may be embodied so that a controller or a processor of the temperature calibrator directs the elements and functional units defined in the embodiments of the invention. A piece of software can be stored in a memory, and a computer program comprising program code can be executed by the processor or the controller. Especially the sources 33, 34 and relays 35, 37 are controlled by the processor or controller of the temperature calibrator in this manner.

Thus, in an aspect of the present invention, the steps of the presented method may be implemented by executing an appropriate computer program in a processor of the temperature calibrator (or in some other device), where the steps defined in the computer program correspond with the determined method steps, where applicable. In an aspect, also a computer program product is a part of the inventive concept.

The present invention is not restricted merely to embodiments presented above, but the scope of protection for the present invention is determined by the claims.

The invention claimed is:

1. A heating/cooling arrangement for a temperature calibrator, comprising:
   a calibrator block, a processor circuit, heating and cooling elements, and a heatsink, wherein a single element configuration is used both for heating and cooling, wherein the heating/cooling arrangement comprises:
   the heating and cooling elements comprising inner Peltier elements and outer Peltier elements with regard to the calibrator block, wherein the inner Peltier elements comprise elements both in the top and the bottom of the calibrator block, and the outer Peltier elements comprise elements both in the top and the bottom of the calibrator block, and all four Peltier element pairs are independently controllable by four independent driver channels;
   a DC power supply;
   wherein each inner and outer Peltier element are stacked with one another, respectively, and the arrangement further comprises:
   a first variable current or voltage source and a second variable current or voltage source, configured to feed the inner and the outer Peltier elements, respectively; wherein
   the first variable current or voltage source is controlled individually and independently of the second variable current or voltage source, by the processor circuit.

2. The arrangement according to claim 1, wherein the first variable current or voltage source and the second variable current or voltage source are both bipolar.

3. The arrangement according to claim 1, wherein the processor circuit is configured to set a ratio of the first variable current and the second variable current to an optimized value, wherein in order to reach the optimized value, the ratio is set substantially to 2:1 when heating the calibrator block.

4. The arrangement according to claim 1, wherein the first variable current or voltage source and the second variable current or voltage source are both unipolar, and the arrangement further comprises:
   a first mechanical relay selecting the polarity of the first current through the inner Peltier elements, and a second mechanical relay selecting the polarity of the second current through the outer Peltier elements, where
   both first and second mechanical relays are independently controllable by the processor circuit.

5. The arrangement according to claim 1, wherein the processor circuit is configured to set a ratio of the first variable current and the second variable current to an optimized value, wherein in order to reach the optimized value, the ratio is set substantially to 1:2 when cooling the calibrator block.

6. The arrangement according to claim 4, wherein the processor circuit is configured to:
   output from the second variable current or voltage source a relatively small and fixed positive current, resulting in a fixed temperature offset within the outer Peltier elements;
   regulate temperature of the calibrator block by the inner Peltier elements, resulting in a negative current in the first variable current or voltage source for compensating the fixed temperature offset simultaneously with the regulation process,
   resulting in continuously oppositely signed currents between the first and second variable current or voltage sources, leading to a lack of switchings in the mechanical relays.

7. The arrangement according to claim 4, wherein the processor circuit is configured to:
   let the outer Peltier elements to only perform heating;
   let the inner Peltier elements to only perform cooling, resulting in both currents from first and second variable current or voltage sources to not pass zero, leading to a lack of switchings in the mechanical relays.

8. The arrangement according to claim 4, wherein the processor circuit is configured to:
   output from the first variable current or voltage source a relatively small and fixed negative current, resulting in a first fixed temperature offset within the inner Peltier elements;
   output from the second variable current or voltage source a relatively small and fixed positive current, resulting in a second fixed temperature offset within the outer Peltier elements;
   regulate temperature of the calibrator block by both the inner Peltier elements and the outer Peltier elements, resulting in the first and second fixed temperature offsets neutralizing one another at least partly, and
   resulting in continuously oppositely signed currents between the first and second variable current or voltage sources, leading to a lack of switchings in the mechanical relays.

9. A method for controlling a heating/cooling arrangement for a temperature calibrator, the arrangement comprising a calibrator block, a processor circuit, heating and cooling elements, a heatsink and a DC power supply, wherein the heating and cooling elements comprise inner Peltier elements and outer Peltier elements with regard to the calibrator block, wherein each inner and outer Peltier element are stacked with one another, respectively, and the method comprises the following steps of:
   applying a single element configuration used both for heating and cooling;
   feeding a first variable current or voltage from a first variable current or voltage source into the inner Peltier elements;
   feeding a second variable current or voltage from a second variable current or voltage source into the outer Peltier elements; and
   controlling, by the processor circuit, the first variable current or voltage source individually and independently of the second variable current or voltage source,
   wherein the inner Peltier elements comprise elements both in the top and the bottom of the calibrator block, and the outer Peltier elements comprise elements both in the top and the bottom of the calibrator block, and all four Peltier element pairs are independently controllable by four independent driver channels.

10. A non-transitory computer readable medium for controlling a heating/cooling arrangement for a temperature calibrator, the arrangement comprising a calibrator block, a processor circuit, heating and cooling elements, a heatsink and a DC power supply, wherein the heating and cooling elements comprise inner Peltier elements and outer Peltier elements with regard to the calibrator block, wherein each inner and outer Peltier element are stacked with one another, respectively, the non-transitory computer readable medium having program code stored thereon that, in response to execution by the processor circuit, causes the processor circuit to perform the steps of:

feeding a first variable current or voltage from a first variable current or voltage source into the inner Peltier elements;

feeding a second variable current or voltage from a second variable current or voltage source into the outer Peltier elements; and controlling, by the processor circuit, the first variable current or voltage source individually and independently of the second variable current or voltage source, wherein the inner Peltier elements comprise elements both in the top and the bottom of the calibrator block, and the outer Peltier elements comprise elements both in the top and the bottom of the calibrator block, and all four Peltier element pairs are independently controllable by four independent driver channels.

* * * * *